United States Patent [19]

Kawakami et al.

[11] Patent Number: 4,929,491
[45] Date of Patent: May 29, 1990

[54] PRINTED WIRING BOARD

[75] Inventors: Shin Kawakami; Satoshi Haruyama; Hirotaka Okonogi, all of Saitama, Japan

[73] Assignee: Nippon CMK Corp., Japan

[21] Appl. No.: 265,688

[22] Filed: Nov. 1, 1988

[30] Foreign Application Priority Data

Jun. 16, 1988 [JP] Japan ................................. 63-148933
Jun. 16, 1988 [JP] Japan ................................. 63-148934

[51] Int. Cl.$^5$ ............................................... B32B 9/00
[52] U.S. Cl. ................................. 428/195; 428/304.4; 428/413; 428/901; 361/397
[58] Field of Search ............ 428/195, 413, 901, 304.4; 361/397

[56] References Cited

U.S. PATENT DOCUMENTS

| 3,883,352 | 5/1975 | Kloczewski et al. | 430/315 |
| 4,003,877 | 1/1977 | Lipson et al. | 430/281 |
| 4,020,233 | 4/1977 | Morgan | 428/419 |
| 4,064,287 | 12/1977 | Lipson et al. | 430/288 |
| 4,668,603 | 5/1987 | Taylor, Jr. | 430/258 |
| 4,717,643 | 1/1988 | Schere et al. | 430/287 |

FOREIGN PATENT DOCUMENTS 305033 3/1987 Japan .

Primary Examiner—Patrick Ryan
Attorney, Agent, or Firm—Bruce L. Adams; Van C. Wilks

[57] ABSTRACT

The present invention relates to a printed wiring board, and more particularly to a solder resist film applied on the printed wiring board, and to solder resist printing ink utilized to form such solder resist film.

12 Claims, 1 Drawing Sheet

PRINTED WIRING BOARD

TECHNICAL FIELD TO WHICH THE INVENTION RELATES

The present invention relates to a printed wiring board, and more particularly to a solder resist film applied on the printed wiring board, and to solder resist printing ink utilized to form such solder resist film.

DESCRIPTION OF THE PRIOR ART

A conventional printed wiring board is produced by etching a copper film on a copper clad laminated plate, so as to form desired circuit conductors on the upper surface of a base plate. Then, desired electronic devices are mounted on predetermined portions of the conductor pattern.

After such electronic devices are mounted on the printed wiring board, the electric conductor pattern is dipped in a molten solder bath or in an injection soldering bath to adhere solder on the conductor pattern surface to connect electrically and mechanically the lead wires of the electronic devices with the conductor pattern.

As the electronic devices become smaller, the printed wiring boards must be smaller so that the distance between adjacent conductors of the conductor pattern must be narrower. Thus, solder resist film which is applied to adhere solder on predetermined portions of the conductor pattern must precisely cover the small distance between the conductors and inevitably bridging of solder across adjacent conductors by overriding the solder resist film between the conductors occurs.

To overcome such disadvantages, our Japanese Patent Publication No. 54-41102/1979 discloses that on a solder resist film between the conductors, a further solder resist film is applied to prevent bridging of solder across adjacent conductors when the distance between the conductors is very small.

DISADVANTAGES OF THE PRIOR ART

Such a conventional printed wiring board of the above described construction includes disadvantages such that two layers of solder resist film must be formed so that two printing operations with accurate positioning operations are required, and further, when two solder resist films are not sufficient to prevent bridging, a third layer must be applied on the second layer so that disadvantages as to manufacturing efficiency and economy occur.

TECHNICAL PROBLEM

The object of the present invention is to eliminate or at least mitigate the above mentioned disadvantages as to manufacturing and economy and to provide an improved printed wiring board having similar characteristics with those of a conventional printed wiring board and also having further advantages, and further to provide a solder resist printing ink of the solder resist film for the printed wiring board.

SOLUTION OF THE TECHNICAL PROBLEM

Such solder resist film or insulating film is formed by foamed solder resist film.

Preferably, the foamed insulating film has at least twice the volume of the original material.

As to the printing ink for solder resist film, such ink contains foaming material.

Preferably, the printing ink is formed by ultra-violet radiation settable ink of acryl-epoxy resin.

Preferably, the forming material is present in an amount of 2-5 weight percent.

ADVANTAGEOUS EFFECTS OF THE INVENTION

The printed wiring board having a foamed solder resist film which is applied by a foamable solder resist ink, according to the present invention, can form solder resist film of desired thickness corresponding to solder anti-bridging property of particular printed wiring board, simply, accurately and inexpensively.

Particularly, a thick solder resist layer can be formed by one silk screen printed process so that bridging of solder across adjacent conductors of high density during the soldering operation between electronic devices and conductors can be accurately avoided.

Further, the foamed solder resist film absorbs vibration while of the conductors on the printed wiring board so that loss of desired effect as to sound and image is avoided, and accurate signals can be transmitted by accurate operation of the printed wiring board.

Further, the printed wiring board exhibits a heat-dissipating effect for the heat generated by the conductors.

DETAILED DESCRIPTION OF THE PRIOR ART AND OF THE PREFERRED EMBODIMENTS

Figure 2:
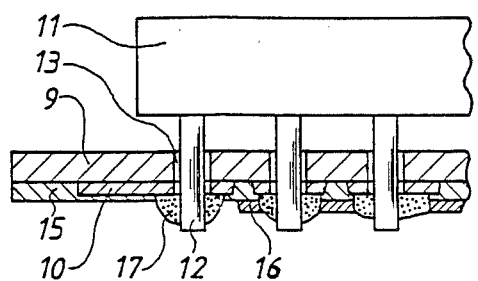
FIGS. 2A and 2B are enlarged sectional and plan views of a portion of a conventional printed wiring board.
Figure 2:
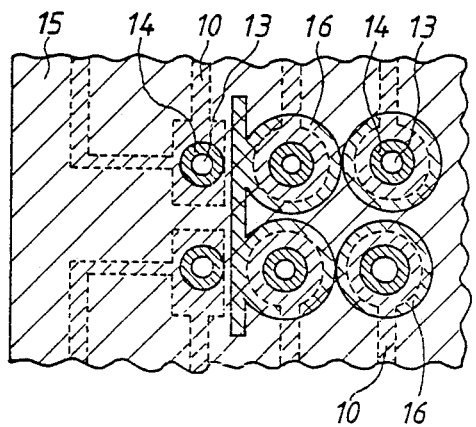

FIGS. 2A and 2B show a conventional printed wiring board described in the above mentioned Japanese Patent Pubn. No. 54-41102/1979. The printed wiring board is produced by etching a copper film on a copper clad laminated insulation base plate 9 so as to form a desired conductor pattern 10. Mounting holes 13 are provided in the base plate 9 to pass through lead terminals 12 of electronic devices 11. On the surface of the base plate forming the conductor pattern, a solder resist layer 15 is applied leaving circular lands 14 encircling the mounting holes to allow soldering the lands 14 with the lead terminals 12.

Further, when the distance between adjacent lands 14 is small, e.g. 0.5 m.m., anti-bridging solder resist layer 16 is applied on the first solder resist layer 15. Thus, by the two layers of such solder resist films 15 and 16, bridging across of solder regions 17 can be effectively prevented during the normal soldering operation. The disadvantages of this structure have been described above.

Now, preferred embodiments of the printed wiring board according to the present invention will be described referring to the drawing.

Figure 1:
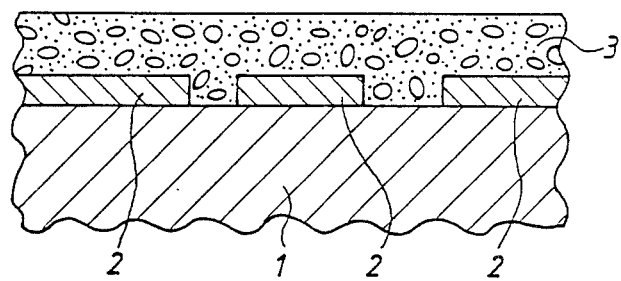
FIG. 1 is an enlarged sectional view of a partial of one embodiment of a printed wiring board, according to the present invention.

Referring to FIG. 1 which shows a preferred embodiment of the present invention, 1 designates a base plate and 2 is a conductor pattern formed on one surface of the base plate 1. According to the present invention, a foamed solder resist film 3 is applied on the surface of the base plate 1 which is on the conductor pattern forming side.

The foamed solder resist film 3 is formed such that one of the solder resist inks listed below is used, and the film 3 is applied on the conductor forming surface of the base plate 1 by silk screen printing process. Then, the base plate 1 is heated to decompose the foaming agent in the ink, e.g. about 100°-200° C., and the film is set by suitable means e.g. by ultra-violet ray radiation.

| Composition 1 | |
| --- | --- |
| epoxy-acrylate | 28 wt. % |
| polyethylene-glycol-acrylate | 72 |
| benzoin-alkyl-ether | 4 |
| titanium-oxide | 5 |
| silicon-oxide | 3 |
| diphenyl-disulfide | 2.0 |
| pigment(cyanin-green) | 0.4 |
| diethyl-hydroxy-amine | 0.1 |
| dimethyl-thyroxine(foam control agent) | 2.0 |
| Viny-hole A C" 1(foaming agent) (sold by Eiwa Kasei Kogyo Co.) | 2-5 |
| Composition 2 | |
| epoxy-acrylate | 28 |
| polyethylene-glycol-acrylate | 72 |
| benzoin-alkyl-ether | 4 |
| titanium-oxide | 5 |
| silicon-oxide | 3 |
| diphenyl-disulfide | 2.0 |
| pigment(cyanin-green) | 0.4 |
| diethyl-hydroxy-amine | 0.1 |
| dimethyl-thyroxine(foam control agent) | 2.0 |
| Viny-hole A C" 3M(foaming agent) (sold by Eiwa Kasei Kogyo Co.) | 3-5 |
| Composition 3 | |
| epoxy-acrylate | 50 |
| polyurethan-acrylate | 50 |
| benzoin-methyl-ether | 4 |
| calcium-carbonate | 5 |
| silicon-oxide | 3 |
| pigment(cyanin-green) | 0.4 |
| benzo-thiazole | 0.05 |
| benzo-phenone | 2.6 |
| dimethyl-thyroxine(foam control agent) | 1.5 |
| Viny-hole FE-90S(foaming agent) (sold by Eiwa Kasei Kogyo Co.) | 5 |
| Composition 4 | |
| epoxy-acrylate | 50 |
| polyurethan-acrylate | 50 |
| benzoin-methyl-ether | 4 |
| calcium-carbonate | 5 |
| silicon-oxide | 3 |
| pigment(cyanin-green) | 0.4 |
| benzo-thiazole | 0.05 |
| benzo-phenone | 2.6 |
| dimethyl-thyroxine(foam control agent) | 1.5 |
| Viny-hole FE-788(foaming agent) (sold by Eiwa Kasei Kogyo Co. Japan) | 3-5 |

The film thickness of the foamed solder resist film 3 can be suitably selected as desired according to the object of all the solder resist film 3 on nearly all the surface or on necessary portions of the conductors 2. The adjustment of the thickness can be easily controlled by the selection from the above described compositions, especially the composition of the foaming agent, and other necessary factors.

The regulation of the film thickness in the silk screen printing process has been a long-standing problem. That is, when much ink is applied to increase thickness, ink spreads from the original width to both sides so that the width is also broadened and the thickness can not have the desired value. Thus, to apply ink between narrow conductors, the thickness of the film available is limited. Consequently, it has heretofore been necessary to apply two layers as described before, to obtain the desired thickness of the solder resist film. The present invention solves this problem and utilizes foamable material so that the silk screen printing process is performed in the ordinary manner because the ink volume applied at first is the same as in the usual process. After the printing process, the printed wiring board is heated to about 100°-200° C. to decompose the foamable material to produce gas so that the volume of the solder resist film increases to more than twice that of the original volume. In this case, the solder resist film does not spread in width so that the film does not migrate to the adjacent conductor, and substantially the thickness of the film increases more than twice. The drying or setting problem of the ink can be solved by utilizing an ultra-violet radiation settable resin or acryl-epoxy resin.

To mount the electronic devices, to prevent solder from bridging across the conductors, preferably the film thickness of the foamed solder resist layer 3 may be more than twice the thickness of conventional insulating film 15 or 16 shown in FIGS. 2A and 2B.

The present invention is not limited to the embodiment shown in which the foamed solder resist film 3 is applied on one side, i.e. conductor applied side of the base plate 1, and can be applied on both sides of the base plate and also can be applied to the electronic devices mounting side as necessary.

As described, the printed wiring board of the present invention, by forming the insulating film as foamed insulating film, attains sufficient anti-bridging function by only one layer of the foamed insulating film, by selecting the necessary thickness of the solder resist film or insulating film as desired, and also, the foamed layer absorbs vibration caused in the conductor circuit while the printed wiring board is operating. Further, a desired heat-dessipating effect can also be expected by use of the foamed insulating layer.

We claim:

1. A printed wiring board comprising: a base plate composed of electrically insulative material and having opposed major surfaces; a conductor pattern printed on at least one major surface of the base plate; and a foamed solder resist film formed on the one major surface of the base plate at least in the region of the conductor pattern, the foamed solder resist film covering the exposed areas of the base plate surface which surround the conductors of the conductor pattern and being composed of a thermally decomposed foamed material.

2. A printed wiring board according to claim 1 ; wherein the foamed solder resist film has a thickness more than twice that which existed before thermal decomposition of the thermally decomposed foamed material.

3. A printed wiring board according to claim 2; wherein the thermally decomposed foamed material comprises material heat-treated to about 100° to 200° C.

4. A printed wiring board according to claim 2; wherein the foamed solder resist film comprises a solder resist film-forming ink having mixed therein a thermally decomposable foamable agent.

5. A printed wiring board according to claim 4; wherein the foamable agent is present in an amount equal to 2 to 5 weight percent of the solder resist film-forming ink.

6. A printed wiring board according to claim 4; wherein the solder resist film-forming ink contains a foam control agent.

7. A printed wiring board according to claim 6, wherein the foam control agent comprises dimethylthyrozixe.

8. A printed wiring board according to claim 1; wherein the thermally decomposed foamed material comprises material heat-treated to about 100° to 200° C.

9. A printed wiring board according to claim 1; wherein the foamed solder resist film comprises a solder resist film-forming ink having mixed therein a thermally decomposable foamable agent.

10. A printed wiring board according to claim 9; wherein the foamable agent is present in an amount equal to 2 to 5 weight percent of the solder resist film-forming ink.

11. A printed wiring board according to claim 9; wherein the solder resist film-forming ink contains a foam control agent.

12. A printed wiring board according to claim 11; wherein the foam control agent comprises dimethylthyrozixe.

* * * * *